(12) United States Patent
Lee et al.

(10) Patent No.: US 6,686,123 B2
(45) Date of Patent: Feb. 3, 2004

(54) PHOTORESIST MONOMER, POLYMER THEREOF AND PHOTORESIST COMPOSITION CONTAINING THE SAME

(75) Inventors: Geun Su Lee, Kyoungki-do (KR); Jae Chang Jung, Kyoungki-do (KR); Min Ho Jung, Kyoungki-do (KR)

(73) Assignee: Hynix Semiconductor Inc, Kyoungki-Do (KR)

( * ) Notice: Subject to any disclaimer, the term of this patent is extended or adjusted under 35 U.S.C. 154(b) by 82 days.

(21) Appl. No.: 10/035,772

(22) Filed: Nov. 9, 2001

(65) Prior Publication Data

US 2002/0061466 A1 May 23, 2002

(30) Foreign Application Priority Data

Nov. 17, 2000 (KR) .......................... 2000-68423

(51) Int. Cl.[7] .......................... G03F 7/004; C08F 214/18
(52) U.S. Cl. .................. 430/270.1; 430/326; 430/907; 526/242; 526/321
(58) Field of Search ................. 526/242, 321; 430/271.1, 270.1, 907, 326

(56) References Cited

U.S. PATENT DOCUMENTS

| | | | |
|---|---|---|---|
| 4,027,081 A | * | 5/1977 | Turner |
| 4,983,495 A | * | 1/1991 | Tsutsumi et al. ........... 430/270 |
| 5,085,975 A | | 2/1992 | Mueller |
| 6,511,787 B2 | * | 1/2003 | Harada et al. ........... 430/270.1 |

OTHER PUBLICATIONS

US 2003/0036016 A1, Feb. 2003 Szmanda et al.*
US 2002/0160297 A1, Oct. 2002 Fedynyshyn et al.*
US 2002/0164538 A1, Nov. 2002 Allen et al.*
US 2002/0058198 A1, May 2002 Klauck-Jacobs et al.*
US 2002/0051940 A1, May 2002 Lee et al.*

* cited by examiner

Primary Examiner—Rosemary Ashton

(74) Attorney, Agent, or Firm—Marshall, Gerstein & Borun LLP

(57) ABSTRACT

Photoresist monomers of following Formulas 1 and 2, photoresist polymers thereof, and photoresist compositions containing the same. The photoresist composition has excellent adhesiveness to a wafer, and is developable in aqueous tetramethylammonium hydroxide (TMAH) solution. In addition, the photoresist composition has low absorbance of light having the wavelength of 157 nm, and thus is suitable for a photolithography process using ultraviolet light sources such as VUV (157 nm) and EUV (13 nm) in fabricating a minute circuit for a high integration semiconductor device.

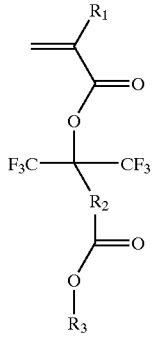

Formula 1

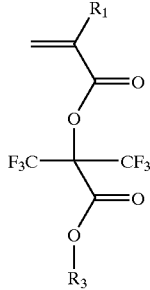

Formula 2 wherein, $R_1$, $R_2$ and $R_3$ are as defined in the specification of the invention.

20 Claims, 2 Drawing Sheets

PHOTORESIST MONOMER, POLYMER THEREOF AND PHOTORESIST COMPOSITION CONTAINING THE SAME

BACKGROUND

1. Technical Field

Photoresist monomers, polymers thereof and photoresist compositions containing the same are disclosed. In particular, photoresist monomers suitable for a photolithography process using DUV (deep ultraviolet) light sources such as VUV (157 nm) and EUV (13 nm) in fabricating a minute circuit for a high integration semiconductor device, photoresist polymers thereof and photoresist compositions containing the same, and preparation processes therefore are disclosed.

2. Description of the Prior Art

In general, a useful photoresist for VUV has a variety of desired characteristics, such as low light absorbance at the wavelength of 157 nm, excellent etching resistance, and excellent adhesiveness to a wafer. In addition, a photoresist should be easily developable in a commercially readily available developing solution, such as 2.38 wt % and 2.6 wt % aqueous tetramethylammonium hydroxide (TMAH) solution.

Recently, there has been much research done on resins having a high transparency at the wavelength of 193 nm and dry etching resistance similar to novolac resin. However, most of the photoresists are not suitable for VUV due to their poor transmittance at 157 nm wavelength.

Photoresists containing fluorine and silicon have good transmittance at these wavelengths. Unfortunately, most photoresists containing fluorine with a polyethylene or polyacrylate polymer backbone have weak etching resistance, low solubility in an aqueous TMAH solution and poor adhesiveness to the silicon wafer.

On the other hand, photoresists containing silicon require a 2-step etching process of HF treatment and $O_2$ treatment. And it is difficult to remove HF completely, which makes these types of photoresists unsuitable to be applied into production.

However, polyethylene or polyacrylate resins comprising fluorine having excellent solubility have been recently developed. Nevertheless, such resins have low adhesiveness to a wafer, low etching resistance and high light absorbance for applying to resist.

SUMMARY OF THE DISCLOSURE

Novel photoresist monomers and polymers thereof that can be used for a light sources such as VUV (157 nm) and EUV (13 nm) are disclosed.

A photoresist composition comprising the photoresist polymer described above is also disclosed.

A semiconductor element produced by using the photoresist composition described above.

DETAILED DESCRIPTION OF THE DRAWINGS PRESENTLY PREFERRED EMBODIMENTS

Figure 1:
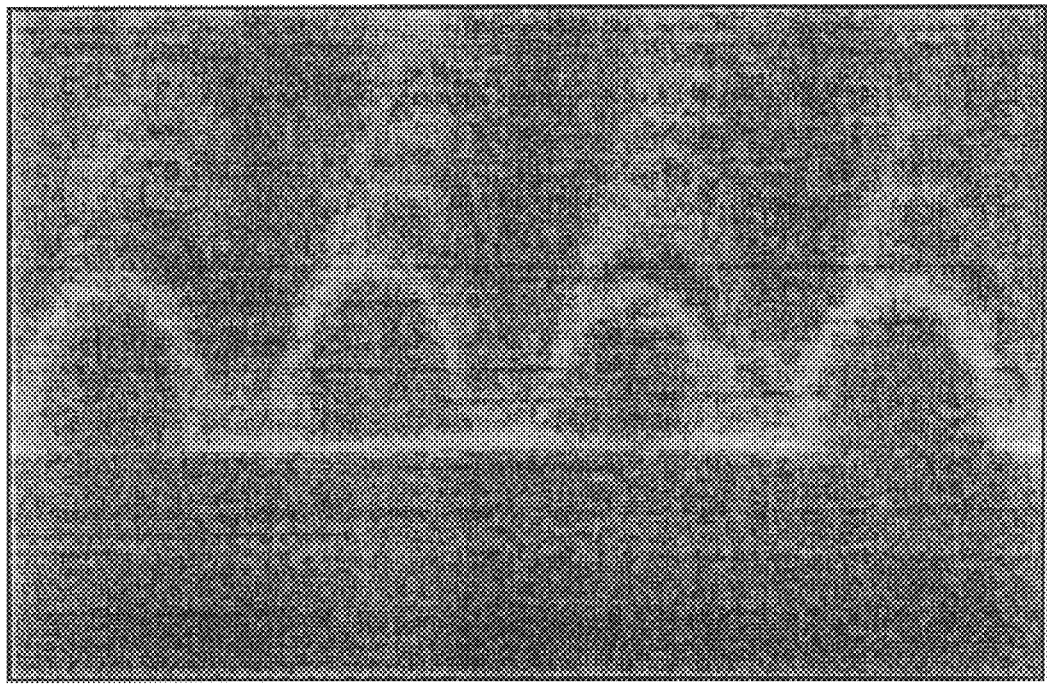
FIG. 1 is a photograph showing a pattern obtained from Example 5.

The photoresist monomer according to the present invention is represented by following Formula 1:

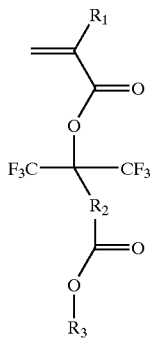

Formula 1 wherein, $R_1$ represents H or $CH_3$; $R_2$ is $(C_1-C_{10})$ alkylene, $(C_1-C_{10})$ alkylene substituted with $(C_1-C_{10})$ alkyl or $(C_1-C_{10})$ alkylene substituted with $(C_1-C_{10})$ aryl; and $R_3$ is an acid labile protecting group.

Another photoresist monomer is represented by the following Formula 2: Formula 2:

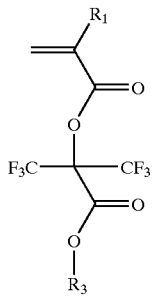

Formula 2 wherein $R_1$ represents H or $CH_3$ and $R_3$ is an acid labile protecting group.

The acid labile protecting group can be any of known protective groups which prevent the compound from dissolving in an alkaline developing solution. However, under the presence of acid, the acid labile group is substituted with acid, thereby making the compound soluble to the alkaline solution. Some of conventional acid labile protecting groups are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000). Acid labile protecting groups of the present invention are preferably selected from the group consisting of substituted or unsubstituted $(C_1-C_{20})$ alkyl, $(C_1-C_{20})$ aryl, $(C_1-C_{20})$ alkoxy, or 5 to 7-membered ring cyclic lactam and more preferably selected from the group consisting of tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, tert-butoxyethyl, 1-isobutoxyethyl and 2-acetylmenth-1-yl.

Preferably, the compound of Formula 2 is selected from the group consisting of compounds of following Formulas 2a and 2b;

(1,1,1,3,3,3-hexafluoro-2-tert-butyl carboxylate) isopropyl methacrylate;

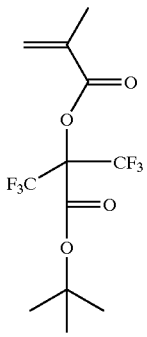

Formula 2a (1,1,1,3,3,3-hexafluoro-2-tert-butyl carboxylate) isopropyl acrylate;

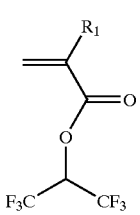

Formula 2b

The compound of Formula 1 can be prepared by reacting the dicarbonate compound and the compound of following Formula 3 after separating α-hydrogen from —CF$_3$ group by using a base in an anhydrous solvent.

Formula 3 wherein, R$_1$ represents H or CH$_3$.

Preferably, the base is NaH, CaH$_2$, alkoxide such as KOtBu (potassium tert-butoxide) or NaOMe, n-BuLi or LDA (lithium diisopropyl amide).

In addition, a photoresist polymer comprising the monomer of Formula 1 is also disclosed.

The photoresist polymer further comprises a monomer of following Formula 4 as a second co-monomer:

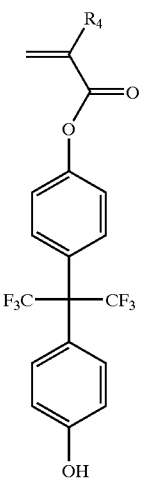

Formula 4 wherein, R$_4$ represents H or CH$_3$.

The photoresist polymer may have repeating unit represented by following Formulas 5 and 6:

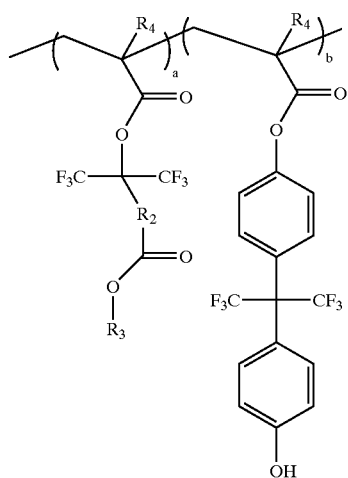

Formula 5a wherein, R$_1$, R$_2$, R$_3$ and R$_4$ are as defined above; and a mole ratio of a:b is 20–100 mol %:0–80 mol %.

A preferred repeating unit according to the present invention includes compound of following Formulas 3a to 3b:

Poly{4-[2-(4-hydroxyphenyl)-1,1,1,3,3,3-hexafluoropropyl]phenyl methacrylate/(1,1,1,3,3,3-hexafluoro-2-tert-butyl carboxylate)isopropyl methacrylate};

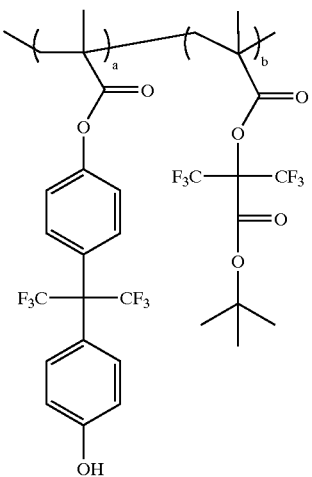

Formula 6

Poly{4-[2-(4-hydroxyphenyl)-1,1,1,3,3,3-hexafluoropropyl]phenyl acrylate/(1,1,1,3,3,3-hexafluoro-2-tert-butyl carboxylate)isopropyl acrylate};

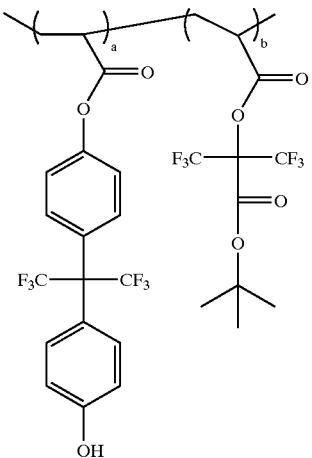

Formula 6

The disclosed photoresist polymer can be prepared by radical-polymerization by using a general radical polymerization initiator. In particularity preferred method, the polymers are prepared by the process including the steps of:

(a) admixing (i) a compound of Formula 1 and optionally (ii) the compound of Formula 2; and (b) adding a polymerization initiator into the resultant to perform a polymerization.

The step (a) is preferably carried out in a conventional organic solvent, for example, tetrahydrofuran, dimethylformamide, dimethylsulfoxide, dioxane, benzene, toluene, xylene and mixture thereof.

The polymerization initiators can be any conventional one, preferably a radical polymerization initiators, for example, 2,2'-azobisisobutyronitrile (AIBN), acetyl peroxide, lauryl peroxide, tert-butyl peracetate, tert-butyl hydroperoxide, di-tert-butyl peroxide, benzoyl peroxide or mixture thereof.

More preferably, after polymerization, the polymer is subject to crystallization and/or purification by using diethyl ether; petroleum ether; lower alcohol containing methanol, ethanol and isopropanol; water and mixtures thereof.

A photoresist composition can comprise (i) a photoresist polymer described above; (ii) a photoacid generator; and (iii) an organic solvent.

Any of conventional photoacid generator, which is able to generate acids when it is exposed to light, can be used. Some of conventional photoacid generator are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000). Preferred photoacid generators have relatively low absorbance in the wavelength of 157 nm and 193 nm. More preferred photoacid generator is phthalimidotrifluoromethane sulfonate, dinitrobenzyltosylate, n-decyl disulfone, naphthylimido trifluoromethane sulfonate or mixtures thereof.

The photoacid generator can further comprise a compound selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, triphenylsulfonium hexafluoroarsenate, triphenylsulfonium hexafluoroantimonate, triphenylsulfonium triflate, dibutylnaphthylsulfonium triflate and mixtures thereof.

Typically, the amount of photoacid generator is from about 0.1 to about 10% by weight of the photoresist polymer employed.

On the other hand, any of conventional organic solvent can be employed for this invention and some of the conventional one are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000). Preferred organic solvents for photoresist composition is ethyl 3-ethoxypropionate, methyl 3-methoxypropionate, cyclohexanone, propylene glycol methyl ether acetate, 2-heptanone, ethyl lactate, ethylene glycol, diethylene glycol, triethylene glycol, ethylene glycol dimethyl ether, ethylene glycol diethyl ether, ethylene glycol dipropyl ether or mixture thereof.

The amount of organic solvent ranges from about 400 to about 3000% by weight of the photoresist polymer to coat the photoresist in a wanted thickness. It has been found that when the organic solvent is used in the amount of 1500 wt %, a thickness of the photoresist is 0.15 $\mu$m.

A process for forming a photoresist pattern can comprise the steps of:

(a) coating the photoresist composition described above on a substrate to form a photoresist film;

(b) exposing the photoresist film to light; and (c) developing the photoresist film.

The process for forming the photoresist pattern can further include a soft baking which is preformed before the step (b) and/or a post baking step which is preformed after the step (b). Preferably, the soft and post baking steps are performed at temperature in the range of from about 10 to about 200° C.

Exemplary light sources which are useful for forming the photoresist pattern include EUV, VUV, ArF, KrF, E-beam, X-ray or ion beam. Preferably, the irradiation energy in the step (b) is in the range of between about 0.1 mJ/cm$^2$ and about 50 mJ/cm$^2$.

Furthermore, a semiconductor device, can be manufactured using the photoresist composition described above.

The disclosed monomers, polymers and photoresist compositions will now be described in more details by referring to examples below, which are not intended to be limiting.

I. PREPARATION OF PHOTORESIST MONOMERS

Example 1
Synthesis of Monomer of Formula 2a 0.1 mole of 1,1,1,3,3,3-hexafluoroisopropyl methacrylate was dissolved in 100 mL of anhydrous tetrahydrofuran, 0.11 mole of NaH was added thereto at a temperature below 0° C., and the resulting solution was stirred for 10 minutes. Then, to the resultant was added the solution obtained by dissolving 0.12 mole of di-tert-butyl dicarbonate in 50 mL of anhydrous tetrahydrous at a temperature below 0° C., and the resulting solution was reacted at a room temperature for 5 hours. The resultant was distilled to remove the solvent and the residue was extracted in aqueous ethyl acetate/0.1 N NaOH solution. The organic layer was dehydrated by $MgSO_4$, and distilled to remove a solvent, thereby obtaining (1,1,1,3,3,3-hexafluoro-2-tert-butyl carboxylate)isopropyl methacrylate of Formula 1a (yield 92%).

Example 2
Synthesis of Monomer of Formula 2b 0.1 mole of 1,1,1,3,3,3-hexafluoroisopropyl acrylate was dissolved in 100 mL of anhydrous tetrahydrofuran, 0.11 mole of KO$^t$Bu (potassium tert-butoxide) was added thereto at a temperature below 0° C., and the resulting solution was stirred for 10 minutes. Thereafter, to the resultant was added the solution obtained by dissolving 0.12 mole of di-tert-butyl dicarbonate in 50 mL of anhydrous tetrahydrofuran at a temperature below 0° C., and the resulting solution was reacted at a room temperature for 5 hours. The resultant was distilled to remove the solvent, and the residue was extracted in aqueous ethyl acetate/0.1 N NaOH solution. The organic layer was dehydrated by $MgSO_4$, and distilled to remove a solvent, thereby obtaining the compound (1,1,1,3,3,3-hexafluoro-2-tert-butyl carboxylate)isopropyl acrylate of Formula 1b (yield 94%).

II. PREPARATION OF PHOTORESIST POLYMERS

Example 3
Synthesis of Poly{4-[2-(4-hydroxyphenyl)-1,1,1,3,3,3-hexafluoropropyl]phenyl methacrylate/(1,1,1,3,3,3-hexafluoro-2-tert-butylcarboxylate) isopropyl methacrylate}

To 100 mL of tetrahydrofuran was added 0.1 mole of 4-[2-(4-hydroxyphenyl)-1,1,1,3,3,3-hexafluoropropyl]phenyl methacrylate, 0.1 mole of (1,1,1,3,3,3-hexafluoro-2-tert-butyl carboxylate)isopropyl methacrylate, and 0.4 g of AIBN, and the resulting solution was reacted at 60° C for 8 hours. Thereafter, a polymer was precipitated and filtered in petroleum ether solution, thereby obtaining the polymer of Formula 6a (yield 58%).

Example 4
Synthesis of Poly{4-[2-(4-hydroxyphenyl)-1,1,1,3,3,3-hexafluoropropyl]phenyl acrylate/(1,1,1,3,3,3-hexafluoro-2-tert-butyl carboxylate) isopropyl acrylate}

To 100 mL of tetrahydrofuran was added 0.1 mole of 4-[2-(4-hydroxyphenyl)-1,1,1,3,3,3-hexafluoropropyl]phenyl acrylate, 0.1 mole of (1,1,1,3,3,3-hexafluoro-2-tert-butyl carboxylate)isopropyl acrylate, and 0.4 g of AIBN, and the resulting solution was reacted at 60° C for 8 hours. Thereafter, a polymer was precipitated and filtered in petroleum ether solution, thereby obtaining the polymer of Formula 6b (yield: 52%).

III. PREPARATION OF PHOTORESIST COMPOSITIONS AND FORMATION OF PATTERNS

Example 5

To 150 g of propylene glycol methyl ethyl acetate (PGMEA) was added 10 g of the polymer of Example 3, 0.06 g of phthalimidotrifluoromethane sulfonate, and 0.06 g of triphenylsulfonium triflate. The resulting solution was filtered through 0.20 μm filter to obtain a photoresist composition.

The photoresist composition thus prepared was spin-coated on silicon wafer to form a photoresist film, and soft-baked in an oven or hot plate of 110° C. for 90 seconds. After baking, the photoresist was exposed to light using a KrF laser exposer, and then post-baked at 110° C. for 90 seconds. When the post-baking was completed, it was developed in 2.38 wt % aqueous TMAH solution for 30 seconds, to obtain 0.13 μm L/S pattern (see FIG. 1).

Example 6

To 150 g of propylene glycol methyl ethyl acetate (PGMEA) was added 10 g of the polymer of Example 4, 0.06 g of phthalimidotrifluoromethane sulfonate, and 0.06 g of triphenylsulfonium triflate. The polymer was precipitated and filtered in 0.20 μm filter to obtain a photoresist composition.

Figure 2:
FIG. 2 is a photograph showing a pattern obtained from Example 6.

The photoresist composition thus prepared was spin-coated on silicon wafer to form a photoresist film, and soft-baked in an oven or hot plate of 110° C. for 90 seconds. After baking, the photoresist was exposed to light using a KrF laser exposer, and then post-baked at 110° C. for 90 seconds. When the post-baking was completed, it was developed in 2.38 wt % aqueous TMAH solution for 30 seconds, to obtain 0.13 μm L/S pattern (see FIG. 2).

As discussed earlier, a photoresist pattern can be formed successfully by employing the photoresist composition of the present invention. Moreover, the photoresist polymer comprising fluorine has low light absorbance at a low wavelength, and thus is suitable for VUV (157 nm) and EUV (13 nm) as well as ArF (193 nm) and KrF (248 nm).

What is claimed:

1. A photoresist monomer represented by a formula selected from the group consisting of Formula 1 and Formula 2:

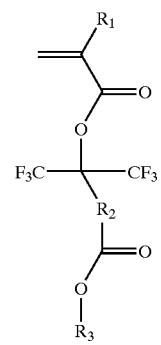

Formula 1

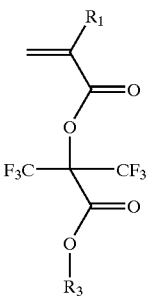

Formula 2 wherein, $R_1$ represents H or $CH_3$;

$R_2$ is selected from the group consisting of ($C_1$–$C_{20}$) alkylene, ($C_1$–$C_{10}$) alkylene substituted with ($C_1$–$C_{10}$) alkyl and ($C_1$–$C_{10}$) alkylene substituted with ($C_1$–$C_{10}$) aryl; and $R_3$ is an acid labile protecting group.

2. The photoresist monomer according to claim 1, wherein the acid labile protecting group is selected from the group consisting of ($C_1$–$C_{20}$) alkyl, ($C_1$–$C_{20}$) aryl, ($C_1$–$C_{20}$) alkoxy and 5 to 7-membered ring cyclic lactam.

3. The photoresist monomer according to claim 1, wherein the acid labile protecting group is selected from the group consisting of tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxyethyl, 1-ethoxy-1-methylethyl, 1-methoxyethyl, 1-ethoxyethyl, tert-butoxyethyl, 1-isobutoxyethyl and 2-acetylmenth-1-yl.

4. The photoresist monomer according to claim 1, wherein the compound of Formula 2 is (1,1,1,3,3,3-hexafluoro-2-tert-butyl carboxylate)isopropyl methacrylate or (1,1,1,3,3,3-hexafluoro-2-tert-butyl carboxylate)isopropyl acrylate.

5. A photoresist polymer comprising the photoresist monomer of claim 1.

6. The photoresist polymer according to claim 5, further comprising a monomer of following Formula 4 as a second co-monomer:

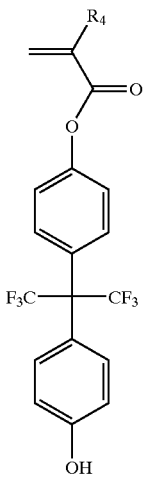

Formula 4 wherein, $R_4$ represents H or $CH_3$.

7. The photoresist polymer according to claim 5, comprising a repeating unit selected from the group consisting of Formula 5 and Formula 6:

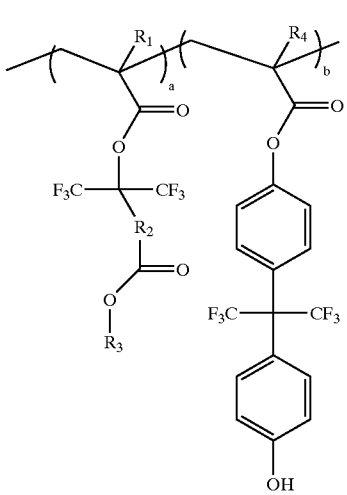

Formula 5

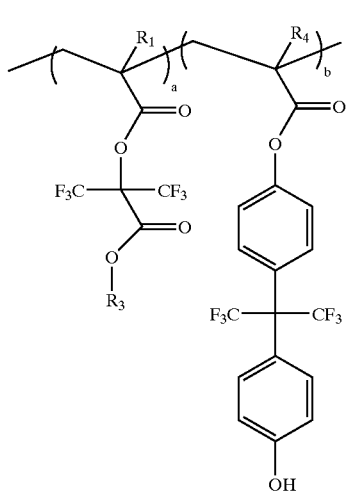

Formula 6 wherein, $R_1$ and $R_4$ represent H or $CH_3$;

$R_2$ is selected from the group consisting of ($C_1$–$C_{10}$) alkylene, ($C_1$–$C_{10}$) alkylene substituted with ($C_1$–$C_{10}$) alkyl and ($C_1$–$C_{10}$) alkylene substituted with ($C_1$–$C_{10}$) aryl;

$R_3$ is an acid labile protecting group; and a:b is 20–100 mol %:0–80 mol %.

8. The photoresist polymer according to claim 5, wherein the repeating unit is selected from the group consisting of poly{4-[2-(4-hydroxyphenyl)-1,1,3,3,3-hexafluoropropyl]phenyl methacrylate/(1,1,1,3,3,3-hexafluoro-2-tert-butyl carboxylate)isopropyl methacrylate} and poly{4-[2-(4-hydroxyphenyl)-1,1,3,3,3-hexafluoropropyl]phenyl acrylate/(1,1,1,3,3,3-hexafluoro-2-tert-butyl carboxylate)isopropyl acrylate}.

9. A photoresist composition comprising:
   (a) a photoresist polymer of claim 5;
   (b) a photoacid generator; and
   (c) an organic solvent.

10. The photoresist composition according to claim 9, wherein the photoacid generator is selected from the group consisting of phthalimidotrifluoromethane sulfonate, dinitrobenzyltosylate, n-decyl disulfone and naphthylimido trifluoromethane sulfonate and mixtures thereof.

11. The photoresist composition according to claim 10, wherein the photoacid generator further comprises the compound selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate and dibutylnaphthylsulfonium triflate and mixtures thereof.

12. The photoresist composition according to claim 9, wherein the amount of photoacid generator ranges from about 0.1 to about 10% by weight of the photoresist polymer employed.

13. The photoresist composition according to claim 9, wherein the organic solvent is selected from the group consisting of ethyl 3-ethoxypriopionate, methyl 3-methoxypropionate, cyclohexanone, propyleneglycol methyl ether acetate, 2-heptanone, ethyl lactate, ethylene glycol, diethylene glycol, triethylene glycol, ethylene glycol dimethyl ether, ethylene glycol diethyl ether, ethylene glycol dipropyl ether and mixtures thereof.

14. The photoresist composition according to claim 9, wherein the amount of organic solvent ranges from 400 to 3000% by weight of the photoresist polymer.

15. A process for forming a photoresist pattern, comprising the steps of:

(a) coating a photoresist composition of claim 9 on a substrate to form a photoresist film;

(b) exposing the photoresist film to light; and (c) developing the photoresist film.

16. The process according to claim 15, farther comprising a soft baking step before step (b) and/or a post baking step after step (b).

17. The process according to claim 15, wherein the soft and post baking steps are performed at the temperature ranging from 10 to 200° C.

18. The process according to claim 15, wherein the sources of the light is selected from the group consisting of EUV, VUV, ArF, KrF, E-beam, X-ray and ion beam.

19. The process according to claim 15, wherein the irradiation energy is in the range of from 0.1 $mJ/cm^2$ to 50 $mJ/cm^2$.

20. A semiconductor element manufactured according to the process of claim 15.

* * * * *

UNITED STATES PATENT AND TRADEMARK OFFICE
CERTIFICATE OF CORRECTION

PATENT NO. : 6,686,123 B2
DATED : February 3, 2004
INVENTOR(S) : Lee et al.

It is certified that error appears in the above-identified patent and that said Letters Patent is hereby corrected as shown below:

Column 9,
Line 17, after "consisting of," please delete "$(C_1-C_{20})$" and insert -- $(C_1-C_{10})$ -- in its place.

Column 10,
Line 54, after "(4-hydroxyphenyl)-," please delete "1, 1, 3, 3, 3" and insert -- 1, 1, 1, 3, 3, 3 -- in its place.

Column 12,
Line 9, after "to claim 15," please delete "farther" and insert -- further -- in its place.

Signed and Sealed this

Twenty-seventh Day of April, 2004

JON W. DUDAS
*Acting Director of the United States Patent and Trademark Office*